United States Patent
Reddy et al.

(10) Patent No.: US 8,527,257 B2
(45) Date of Patent: Sep. 3, 2013

(54) TRANSITION-BASED MACRO-MODELS FOR ANALOG SIMULATION

(75) Inventors: Subodh M. Reddy, San Jose, CA (US); William Walker, Los Gatos, CA (US)

(73) Assignee: Fujitsu Limited, Kawasaki-shi (JP)

(*) Notice: Subject to any disclaimer, the term of this patent is extended or adjusted under 35 U.S.C. 154(b) by 65 days.

(21) Appl. No.: 13/175,456

(22) Filed: Jul. 1, 2011

(65) Prior Publication Data
US 2013/0006595 A1 Jan. 3, 2013

(51) Int. Cl.
*G06F 17/50* (2006.01)

(52) U.S. Cl.
USPC .......................................................... 703/15

(58) Field of Classification Search
None
See application file for complete search history.

(56) References Cited

U.S. PATENT DOCUMENTS

| | | | | |
|---|---|---|---|---|
| 5,222,030 A | * | 6/1993 | Dangelo et al. | 716/102 |
| 5,572,437 A | * | 11/1996 | Rostoker et al. | 716/105 |
| 6,470,482 B1 | | 10/2002 | Rostoker et al. | 716/6 |
| 6,480,816 B1 | | 11/2002 | Dhar | 703/14 |
| 6,898,767 B2 | | 5/2005 | Halstead | 716/3 |
| 7,269,809 B2 | | 9/2007 | Shastri et al. | 716/5 |
| 8,201,137 B1 | * | 6/2012 | Bhushan et al. | 716/139 |

* cited by examiner

*Primary Examiner* — David Silver
(74) *Attorney, Agent, or Firm* — Baker Botts L.L.P.

(57) ABSTRACT

A method may include generating logical transition data for the logic cell based on an analysis of a digital model for the logic cell, the logical transition data including at least one entry indicative of an output transition of the logic cell occurring in response to an input transition of the logic cell. The method may also include generating a parameterized transition based analog model for the logic cell, the parameterized transition based analog model including transition timing parameters associated with each entry of the logical transition data. The method may further include generating an analog model for the logic cell based on the parameterized transition based analog model and one or more analog netlists characterizing the logic cell.

21 Claims, 4 Drawing Sheets

TRANSITION-BASED MACRO-MODELS FOR ANALOG SIMULATION

TECHNICAL FIELD

This disclosure relates in general to modeling circuit designs for simulation and verification and more particularly to a method and system for system-level simulation and verification of physical designs.

BACKGROUND

Integrated circuits may comprise digital, analog, or mixed-signal circuits. Mixed-signal designs that include both analog and digital blocks in the same integrated circuit are becoming increasingly ubiquitous. Often, mixed-signal integrated circuits may be partitioned into functional blocks. Such partitioning may separate analog and digital portions of the circuit into blocks so as to make the complexity involved in designing such integrated circuits more manageable. These individual blocks may be separately designed and verified using electronic design automation (EDA) tools appropriate for design or verification of the functionality of the blocks. In addition, each block may be either automatically synthesized for physical layout using EDA tools or may be manually laid out. The physical blocks may then be assembled together either in layout or on a circuit to form a complete design of the mixed-signal circuit.

Sizes of integrated circuits have grown to include billions of transistors, leading to massive complexity in verifying physical designs at the system level prior to tape-out. For verification, analog designers would prefer for the entire system to be simulated with SPICE-like accuracy and digital designers would prefer advanced verification methodologies that essentially abstract away analog components.

For the foregoing reasons, approaches to reduce the complexity of verification, while still maintaining an effective level of verification, are desired.

SUMMARY OF THE DISCLOSURE

The present disclosure discloses methods and systems for reducing or eliminating disadvantages and problems associated with existing methods and systems for verifying mixed-signal integrated circuits.

A method may include generating logical transition data for the logic cell based on an analysis of a digital model for the logic cell, the logical transition data including at least one entry indicative of an output transition of the logic cell occurring in response to an input transition of the logic cell. The method may also include generating a parameterized transition based analog model for the logic cell, the parameterized transition based analog model including transition timing parameters associated with each entry of the logical transition data. The method may further include generating an analog model for the logic cell based on the parameterized transition based analog model and one or more analog netlists characterizing the logic cell. The analog model may include: (i) one or more input nodes, each input node representing an input of the logic cell; (ii) one or more output nodes, each output node representing an output of the logic cell; (iii) a logic block for modeling Boolean logic of the logic cell, the logic block receiving each of the one or more input nodes as an input and configured to calculate an output based on the received input; (iv) a multiplexer receiving the output of the logic block as a select input, and receiving a low threshold signal and a high threshold signal at its data inputs and configured to output a transitioning analog signal; (v) a transition-based parameter block receiving each of the one or more input nodes as an input and configured to, based on values of the one or more input nodes and parameters selected from the parameterized transition based analog model, output transition timing parameters; and (vi) a transition function block receiving the output of the multiplexer and the transition timing parameters, the transition function block configured to output an output logic signal, the output logic signal modeling behavior of the logic cell in response to inputs to the one or more input nodes.

Technical advantages of certain embodiments of the present disclosure may include approaches to model logic cells of mixed-signal circuit in an analog modeling language to preserve loading and timing characteristics as well as logic functions of the logic cell. Such modeling allows for more efficient simulation and verification of a larger circuit including the logic cell, as compared with traditional approaches.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Embodiments and their advantages are best understood by reference to FIGS. 1-6, wherein like numbers are used to indicate like and corresponding parts.

Figure 1:
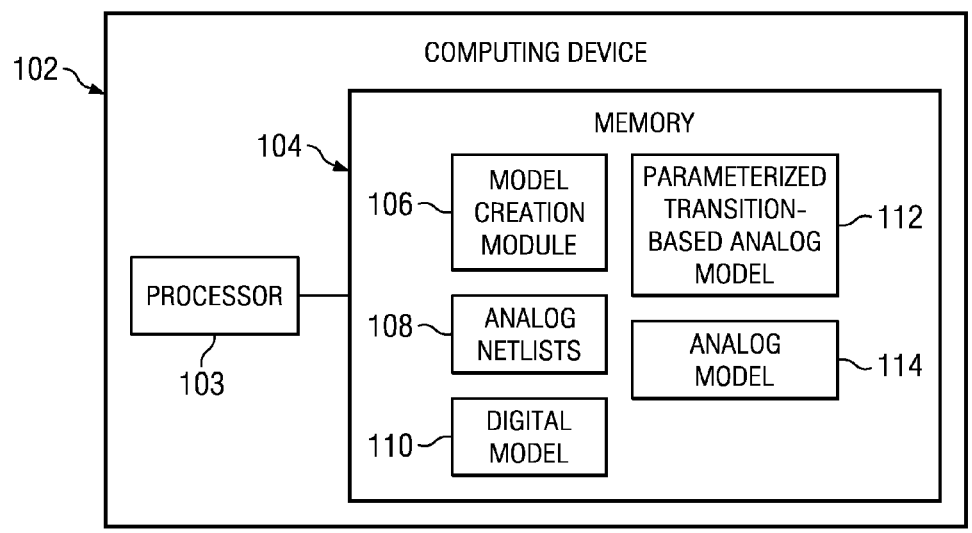
FIG. 1 illustrates a block diagram of an example computing device, in accordance with certain embodiments of the present disclosure.
Figure 3:
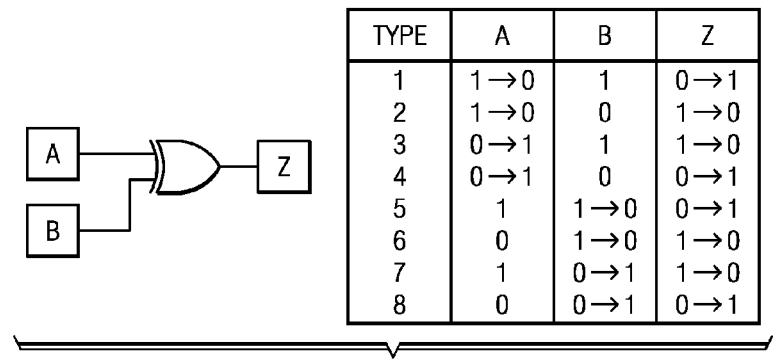
FIG. 3 illustrates an XOR logic gate and a set of transition set of input-output transition paths for the XOR logic gate, in accordance with certain embodiments of the present disclosure.

FIG. 1 illustrates a block diagram of an example computing device 102, in accordance with certain embodiments of the present disclosure. Computing device 102 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, computing device 102 may be a personal computer, a network storage device, or any other suitable device and may vary in size, shape, performance, functionality, and price. In certain embodiments, computing device 102 may be a personal computer or a workstation (e.g., a desktop computer or a portable computer). In other embodiments, computing device 102 may include a server. As depicted in FIG. 1, computing device 102 may comprise a processor 103 and a memory 104 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated memory 104.

Memory 104 may be communicatively coupled to processor 103 and may comprise any system, device, or apparatus configured to retain program instructions or data for a period of time (e.g., computer-readable media). Memory 104 may comprise random access memory (RAM), electrically erasable programmable read-only memory (EEPROM), a PCM-CIA card, flash memory, magnetic storage, opto-magnetic storage, solid state storage, or any suitable selection and/or array of volatile or non-volatile memory that retains data after power to computing device 102 is turned off. As shown in FIG. 1, memory 104 may have stored thereon a model creation module 106, analog netlists 108, a digital model 110, a parameterized transition-based analog model 112, and an analog model 114.

Model creation module 106 may comprise any system, device, or apparatus configured to receive analog netlists 108, digital models 110, and/or other suitable data and based on analysis of such data, generate an analog model for a given logic cell. Details regarding the functionality of model creation module 106 and its generation of analog models of logic cells is set forth in greater detail with respect to the descriptions of FIGS. 2-6 below.

Analog netlists 108 may include, with respect to a given logic cell, one or more data files setting forth analog circuit elements of such logic cell and/or characteristics of such logic cell abstracted or modeled by analog circuit elements. For example, analog netlists 108 for a given logic cell may include a SPICE netlist with layout-extracted parasitic capacitances and resistances for the given logic cell, fanout data for the cell (e.g, ratios of the output capacitance of the cell to the input capacitance of the cell, and/or other suitable analog component representations of a logic cell).

Digital model 110 may include, with respect to a given logic cell, one or more data files including digital modeling language. For example, digital model 110 for a given logic cell may include a Verilog, VHDL, or other logic listing detailing a logical representation of the given cell.

Parameterized transition-based analog model 112 may comprise a parameterized model of a given logic cell generated based on input-output transition paths (generated based on analysis of digital model 110, as described in greater detail below) and analog netlists 108 (e.g., a layout-extracted SPICE parasitic resistance and capacitance netlist). Such parameterized model may include various parameters (e.g., delay, rise time, fall time, output resistance, etc.) associated with each input-output transition of a logic cell. In some embodiments, parameterized transition-based analog model 112 may be embodied in an analog modeling language (e.g., VerilogA). Parameterized transition-based analog model 112 may be generated by model creation module 106, as set forth in greater detail with respect to the descriptions of FIGS. 2-6 below.

Analog model 114 may include, with respect to a given logic cell, an analog representation of the logic cell which may be used in connection with analog models for other logic cells to perform simulation and/or verification of a circuit. In some embodiments, analog model 114 may be embodied in an analog modeling language (VerilogA). Analog model may be generated by model creation module 106, as set forth in greater detail with respect to the descriptions of FIGS. 2-6 below.

Figure 2:
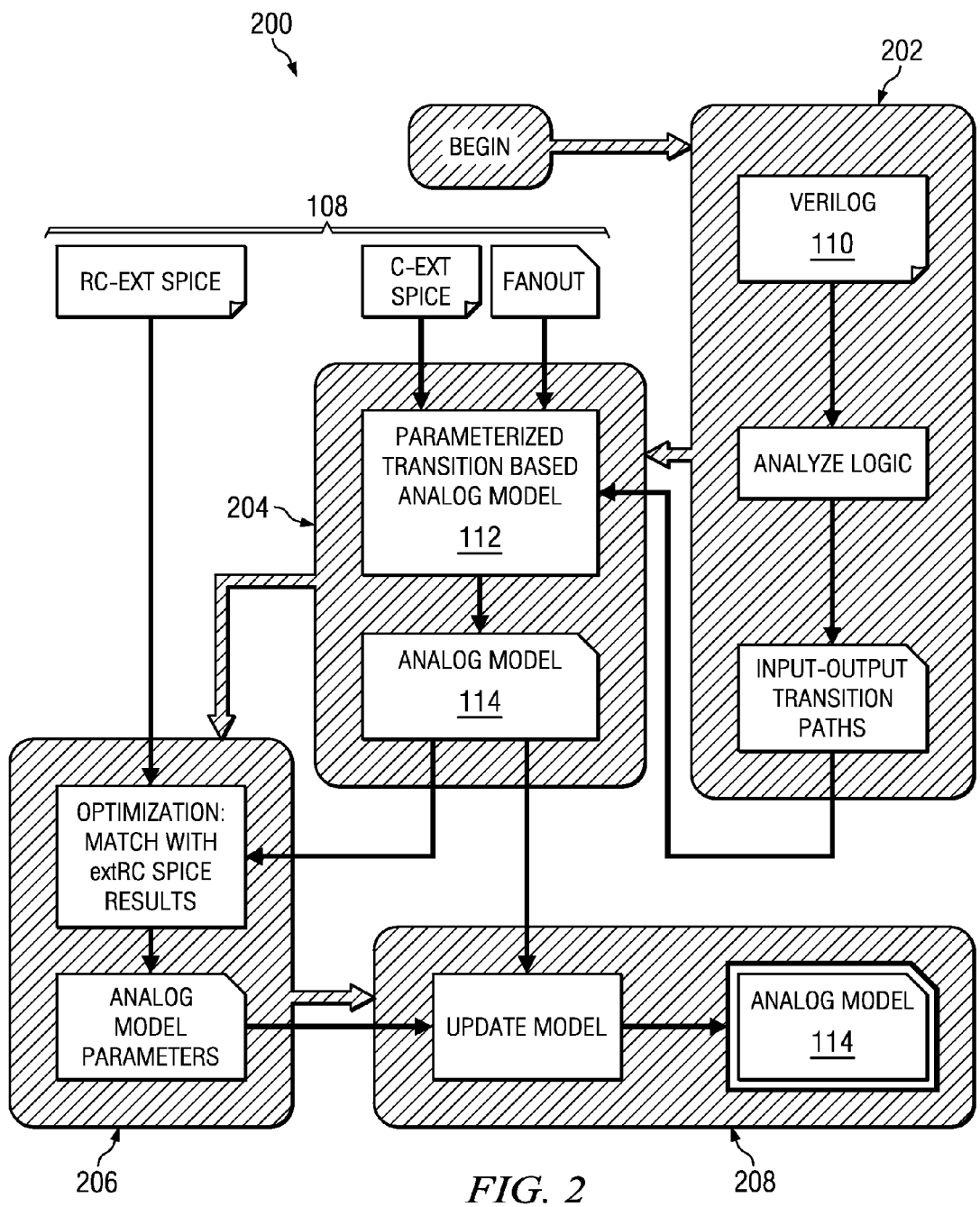
FIG. 2 illustrates a diagram of an example flow for generating an analog model for a given logic cell, in accordance with certain embodiments of the present disclosure.

FIG. 2 illustrates a diagram of an example flow 200 for generating an analog model 114 for a given logic cell, in accordance with certain embodiments of the present disclosure. As shown in FIG. 2, flow 200 may include four main steps 202-208. Although four such steps are depicted, it is noted that in some embodiments, the steps may occur in a different order. In these and other embodiments, generation of an analog model 114 may be accomplished using greater or fewer steps.

In step 202, model creation module 106 may read and analyze logical relationships between inputs and outputs of a logic cell, as such logic cell is modeled in digital model 110. Based on these logical relationships, all possible input conditions that yield a transition at the output of the logic cell may be collected and stored as logical transition data for the logic cell. As an illustrative example, FIG. 3 sets forth a standard XOR logic gate and logical transition data including a set of input-output transition paths that might be generated based analysis of a digital model (e.g., a Verilog model) for the XOR gate. In some embodiments, user preferences may be incorporated into the modeling transitions generated in step 202. For example, simpler transition models may be used to improve performance at the risk of losing accuracy. Such a simple model may include a one input to one output transition arc without considering changes at other inputs. In addition, to setting forth the input transitions and output transitions of a logic cell, logical transition data may also set forth other information regarding the logic cell, including without limitation transition times or slew rates of the input transitions and output load of the logic cell.

Figure 4:
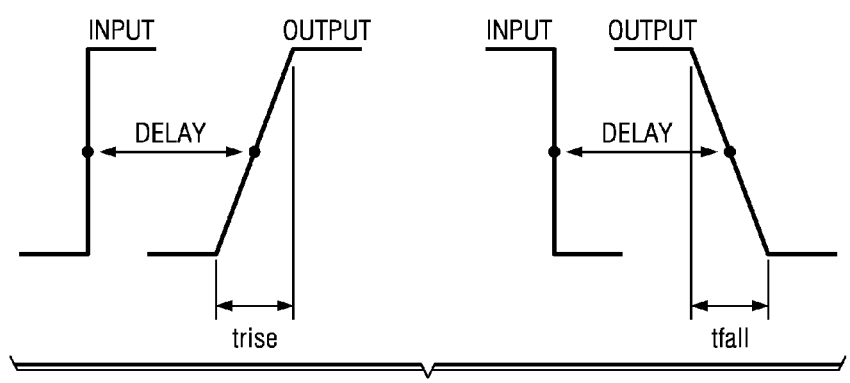
FIG. 4 illustrates signal plots of example input and output waveforms demonstrating variables of a transition function, in accordance with certain embodiments of the present disclosure.

In step 204, model creation module 106 may read and analyze one or more of analog netlists 108 (e.g., a layout-extracted SPICE parasitic capacitance netlist and fanout data) and the logical transition data generated in step 202 in order to generate parameterized transition-based analog model 112. Parameterized transition-based analog model 112 may be based on a transition function (e.g., transition function 516 described in greater detail below). Operation of the transition function is illustrated in FIG. 4. A transition function may comprise an operation on an input operand that may generate an output transition. A delay of the output transition from an input transition, as well as rise and/or fall times of the output transition may be specified as parameters to the transition function. A point of transition may be a single point on a transition signal waveform at whose time the type of transition may be deduced. Often, the point of transition is the point at which a signal crosses the mid-point between a low threshold of the signal and a high threshold of the signal. In the event that spurious transitions are to be modeled, the point of transition may be defined as small percentage or any change from a current value. The parameter delay may comprise a time delay from the point of transition (e.g., midpoint) of an input to the point of transition (e.g., midpoint) of its corresponding output. The parameters trise and tfall may comprise the rise time and fall time, respectively, of the output transition.

Parameters delay, trise, and tfall may be constants or may be variables whose values may be controlled by other portion of analog model 114.

Figure 5:
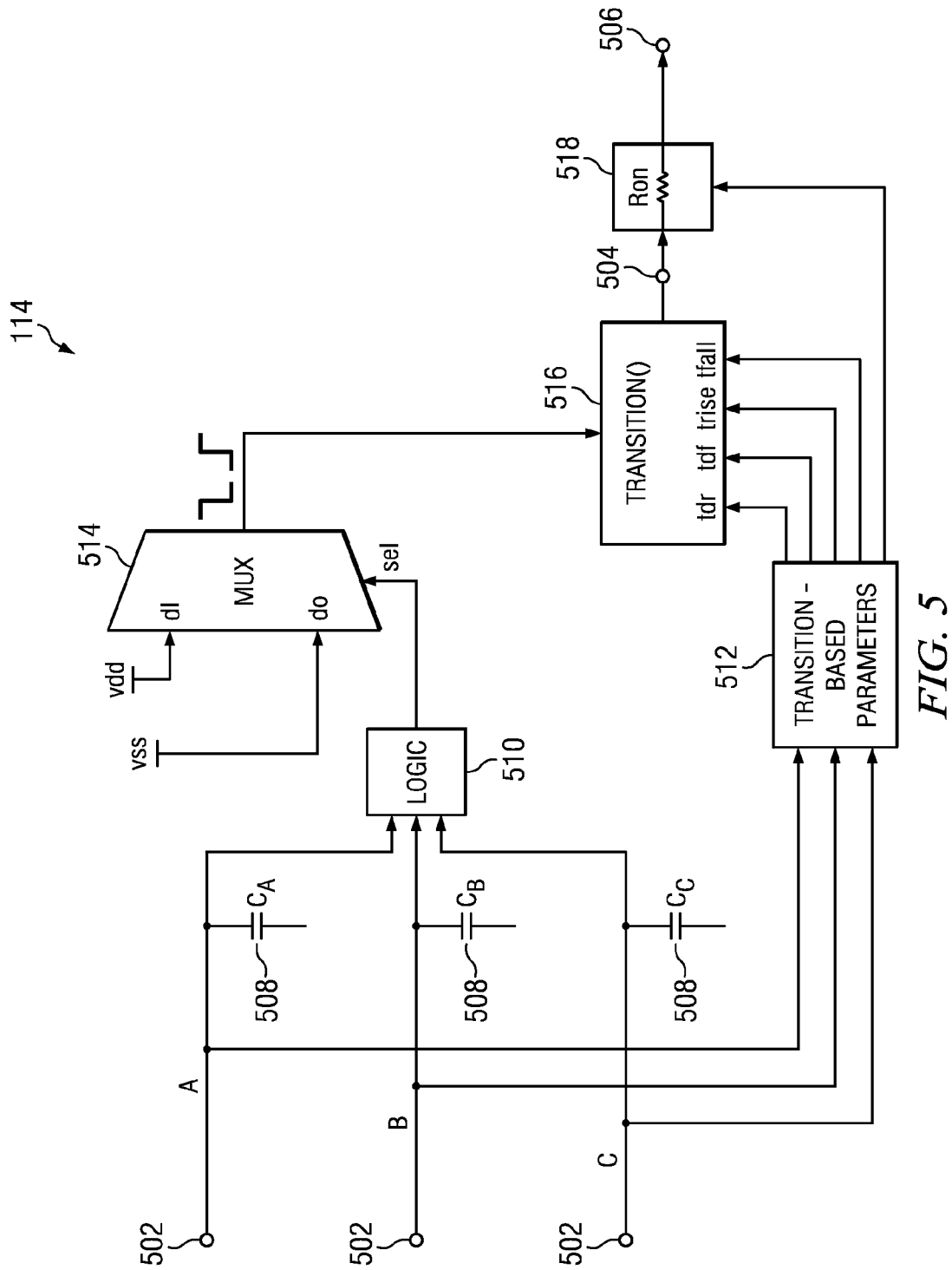
FIG. 5 illustrates a an example analog model of a given logic cell, in accordance with certain embodiments of the present disclosure.

For parameterized transition-based analog model 112, every entry in the logical transition data created in step 202 may map into a set of parameters. Such parameters for each entry may include rise delay (tdr), fall delay (tdf), rise transition time (trise), fall transition time (tfall), and output resistances for falling and rising transitions (Ronf and Ronr, respectively). In other words, tdr, tdf, trise, and tfall arguments of the transition function and Ronf and Ronr may each be modeled as ranges of a function whose domain is the set of elements in the transition table. Ronf and Ronr may be used to model delay effects caused by an output load, as described in greater detail below. Such parameter functions may be represented by the following equations representing the transition of an output from 0 to 1 following the transition of an input;

$V(504)=vss$ when $t<tin01+tdr-trise/2$ $V(504)=vss+(vdd-vss)\cdot(t-tin01-tdr+trise/2)/trise$ when $(tin01+tdr-trise/2) \leq t \leq (tin01+tdr+trise/2)$ $V(504)=vdd$ when $t>tin01+tdr+trise/2$ $Ronr \cdot C_{load} \cdot dV(506)/dt = V(506) - V(504)$ Where t is the time, V(504) is the voltage on node 504 in FIG. 5, V(506) is the voltage of node V(506) in FIG. 5, tin01 is the absolute time of a transition of the input to the gate causing the output to switch from logic 0 to logic 1, $C_{load}$ is the lumped capacitance load on node 506 in FIG. 5, dV(506)/dt is the derivative of V(506) with respect to t, and tdr, trise, and Ronr are the analog model parameters. In practice, when using VerilogA as the modeling language, a simulator may smooth the V(504) transition so the equation representing V(504) is an approximation. The final linear differential equation is solved by the simulator to compute V(506). It should be noted that the simulator has no restriction that the load on node 506 is lumped. However, when building a model in accordance with this disclosure, using lumped capacitive loads simplifies the extraction of parameter Ronr from simulation output. The equations for V(504) and V(506) for a falling transition take the same form as the above equations, except the model parameters are replaced by tdf, tfall, and Ronf, and vdd and vss are swapped.

From the parameterized transition-based analog model 112, analog model 114 may be generated. FIG. 5 illustrates an example analog model 114 of a given logic cell, in accordance with certain embodiments of the present disclosure. Analog model 114 may include one or more input nodes 502, one or more internal output nodes 504, and one or more output nodes 506. Input nodes 502 may represent inputs of the logic cell being modeled, and output nodes 504 may represent the outputs of the logic cell being modeled. As shown in FIG. 5, each input node 502 may be coupled to a respective input capacitance 508. Each input capacitance may be obtained based on one or more values in analog netlists 108 (e.g., capacitance-extracted SPICE netlists).

Inputs nodes 502 may be coupled to each of a logic block 510 and a transition-based parameter block 512. Logic block 510 may model Boolean logic of the logic cell being modeled. Based on input values on input nodes 502 and a logic expression of logic block 510, logic block 510 may calculate an output Boolean value. The output of logic block 510 may be coupled to a select port of a multiplexer stage 514. Input ports of multiplexer stage 514 may be respectively coupled to a low threshold signal level (e.g., vss) and a high threshold signal level (e.g., vdd). Thus, the output of multiplexer stage 514 may yield a transition in the analog signal domain. Such transition may be applied as an input operand to transition function 516.

Transition-based parameter block 512 may be based on or may be equivalent to parameterized transition-based analog model 112. Based on input transitions on input nodes 502 and parameterized functions of parameterized transition-based analog model 112, transition-based parameter block 512 may output values for delay, trise, and tfall. Such output values may be applied as input operands to transition function 516.

Based on its input operands, transition function 516 may output to an internal output node 504 an analog signal with characteristics (e.g., slews and delays) approximating characteristics similar to those that would be seen if a logic cell were fully synthesized and modeled using analog-only components. The delay modeled by transition function 516 may comprise a delay present in an unloaded output. Accordingly, resistance Ron 518 may be coupled between internal output node 504 and output node 506, such that delay affects caused by an output load may be modeled on output node 506. Moreover, the value of Ron may be modified dynamically in analog model 114 to represent the effect of rising and falling output transitions, and the effect of different input to output paths. Although FIG. 5 depicts analog model 114 as a schematic with various component blocks, analog model 114 and its various components may be modeled in an analog modeling language (e.g., VerilogA).

Figure 6:
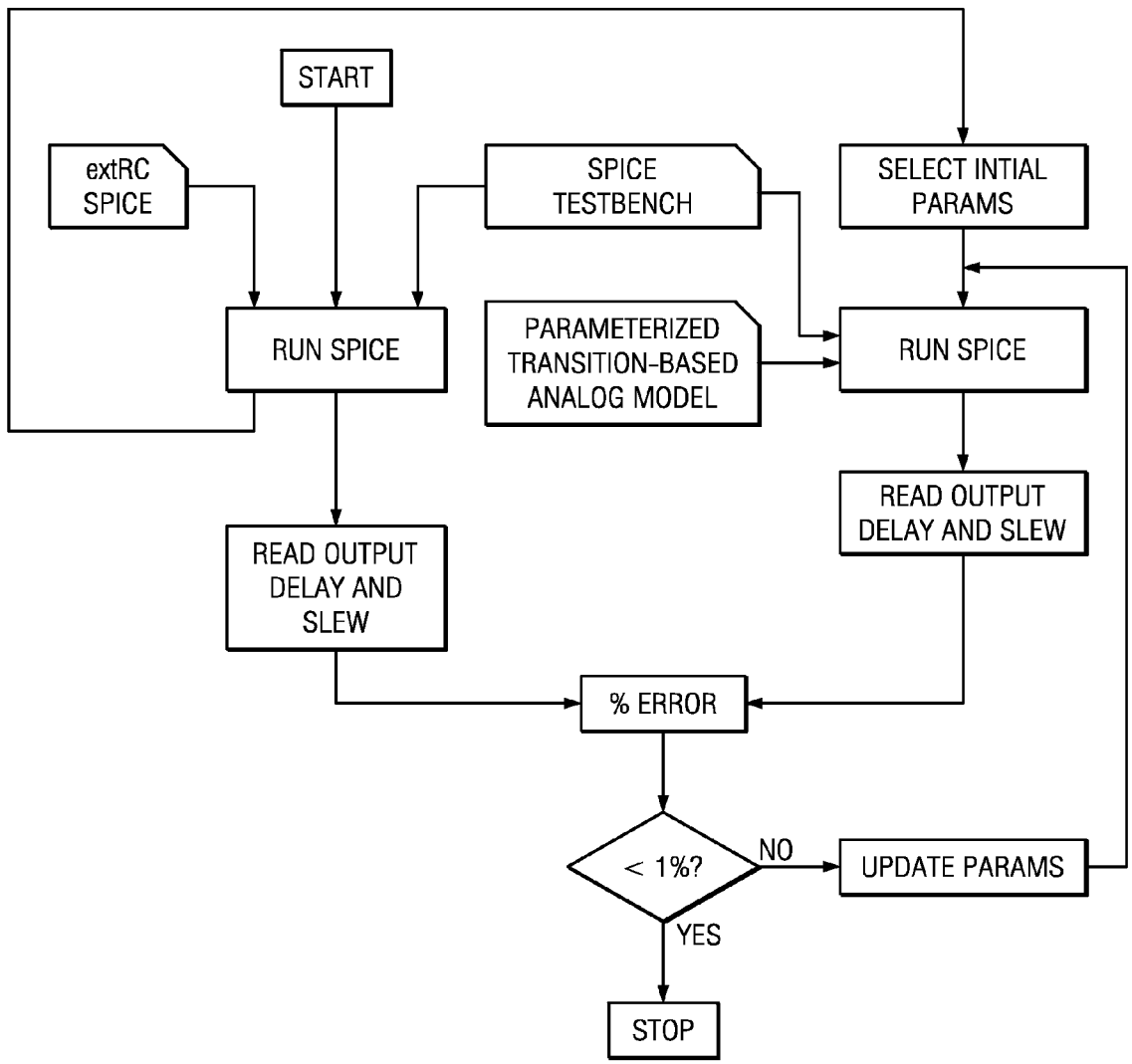
FIG. 6 illustrates a diagram of an example flow for optimizing an analog model of a given logic cell, in accordance with certain embodiments of the present disclosure.

At step 206, model creation module 106 may perform an optimization step to determine optimum values of parameterized transition-based analog model 112. FIG. 6 illustrates a diagram of an example flow for optimizing an analog model 114 of a given logic cell, in accordance with certain embodiments of the present disclosure. To perform such optimization, an analog simulation test bench (e.g., using SPICE) may be created for the given logic cell to measure output delays and slews for all entries of the logical transition data created for the logic cell in step 202. The test bench may include as many instances of the logic cell as there are entries in the logical transition data. Each entry of in the logical transition data may have a corresponding instance of the logic cell with an input excitation and an output load matching entry. This test bench may be executed with parasitic characteristics of the logic cell as embodied in analog netlists 108 (e.g., a resistance/capacitance extracted netlist), and the delays and transition (slew) times of the outputs of the logic cell may be recorded for comparison.

As part of the optimization, the test bench may also be executed with parameterized transition-based analog model 112 and selected parameters for parameterized transition-based analog model 112. Delays and transition times of the outputs of the logic cell may be compared to the earlier recorded simulation that included the parasitic characteristics. If the percentage error between the delays and transition times of the parasitic characteristic simulation and the parameter-base simulation is less than a particular value (e.g., 1% as shown in FIG. 6), the optimization step may end, and the selected parameters may be stored. If the percentage error is greater than the particular value, the loop depicted in FIG. 6 may be repeated with different values of parameters. The different parameters may be selected by standard numerical methods including, for example, bisection, Newton-Raphsom, Levenberg-Marquardt, or others, based on results of previous iterations of the loop depicted in FIG. 6. In addition or alternatively, some commercial simulators (e.g., HSPICE) may have built-in optimizers employed to execute interation of the loop internally. In some embodiments, the loop may iterate until the percentage error is lesser than the particular value. In other embodiments, the loop may terminate after a particular number of iterations.

At step 208, model creation module 106 may update analog model 114 with the analog model parameters selected in the optimization of step 206. Analog model 114 may be used to model its respective logic cell in a simulation and/or verification of a larger mixed-signal circuit including the logic cell.

A component of computing device 102 may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible computer readable storage media and may perform operations when executed by a computer (e.g., computing device 102). Certain logic, such as a processor, may manage the operation of a component. Examples of a processor include one or more computers, one or more microprocessors, one or more applications, and/or other logic.

A memory stores information. A memory may comprise one or more tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Versatile Disk (DVD)), database and/or network storage (for example, a server), and/or other computer-readable medium.

Modifications, additions, or omissions may be made to computing device 102 without departing from the scope of the invention. The components of computing device 102 may be integrated or separated. Moreover, the operations of system 100 may be performed by more, fewer, or other components. Additionally, operations of computing device 102 may be performed using any suitable logic. As used in this document, "each" refers to each member of a set or each member of a subset of a set.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method for generating an analog model of a logic cell, comprising:
    generating logical transition data for the logic cell based on an analysis of a digital model for the logic cell, the logical transition data including at least one entry indicative of an output transition of the logic cell occurring in response to an input transition of the logic cell;
    generating a parameterized transition based analog model for the logic cell, the parameterized transition based analog model including transition timing parameters associated with each entry of the logical transition data; and
    generating an analog model for the logic cell based on the parameterized transition based analog model and one or more analog netlists characterizing the logic cell, the analog model including:
        one or more input nodes, each input node representing an input of the logic cell;
        one or more output nodes, each output node representing an output of the logic cell;
        a logic block for modeling Boolean logic of the logic cell, the logic block receiving each of the one or more input nodes as an input and configured to calculate an output based on the received input;
        a multiplexer receiving the output of the logic block as a select input, and receiving a low threshold signal and a high threshold signal at its data inputs and configured to output a transitioning analog signal;
        a transition-based parameter block receiving each of the one or more input nodes as an input and configured to, based on values of the one or more input nodes and parameters selected from the parameterized transition based analog model, output transition timing parameters; and
        a transition function block receiving the output of the multiplexer and the transition timing parameters, the transition function block configured to output an output logic signal, the output logic signal modeling behavior of the logic cell in response to inputs to the one or more input nodes.

2. A method according to claim 1, the analog model comprising one or more input capacitances, each input capacitance coupled to a respective input node.

3. A method according to claim 1, the analog model comprising a resistance coupled to the output of the transition block, the resistance modeling a load at the output of the logic cell.

4. A method according to claim 1, the transition timing parameters for a particular entry including at least one of: a delay between the input transition and the output transition for the particular entry, an output transition rise time for the particular entry, an output transition fall time for the particular entry, and a load resistance for the particular entry for modeling output load for the particular entry.

5. A method according to claim 1, further comprising optimizing the analog module, wherein optimizing the analog module comprises:
    simulating the analog model based on parasitic capacitances of the logic cell as written in one or more analog netlists to determine a first set of output timing characteristics of the logic cell;
    simulating the analog model based on selected parameters of the parameterized transition-based analog model to determine a second set of output timing characteristics of the logic cell; and
    updating the analog model to include the selected parameters if a percentage error between the first set of output timing characteristics of the logic cell and the second set of output timing characteristics of the logic cell are within a tolerance.

6. A method according to claim 1, the digital model written in a digital modeling language.

7. A method according to claim 1, the analog model written in an analog modeling language.

8. A method according to claim 1, the parameterized transition based analog model written in an analog modeling language.

9. An article of manufacture, comprising:
    a non-transitory computer readable medium; and
    computer-executable instructions carried on the computer readable medium, the instructions readable by a processor, the instructions, when read and executed, for causing the processor to:
        generate logical transition data for the logic cell based on an analysis of a digital model for the logic cell, the logical transition data including at least one entry indicative of an output transition of the logic cell occurring in response to an input transition of the logic cell;

generate a parameterized transition based analog model for the logic cell, the parameterized transition based analog model including transition timing parameters associated with each entry of the logical transition data; and generate an analog model for the logic cell based on the parameterized transition based analog model and one or more analog netlists characterizing the logic cell, the analog model including:

one or more input nodes, each input node representing an input of the logic cell;

one or more output nodes, each output node representing an output of the logic cell;

a logic block for modeling Boolean logic of the logic cell, the logic block receiving each of the one or more input nodes as an input and configured to calculate an output based on the received input;

a multiplexer receiving the output of the logic block as a select input, and receiving a low threshold signal and a high threshold signal at its data inputs and configured to output a transitioning analog signal;

a transition-based parameter block receiving each of the one or more input nodes as an input and configured to, based on values of the one or more input nodes and parameters selected from the parameterized transition based analog model, output transition timing parameters; and a transition function block receiving the output of the multiplexer and the transition timing parameters, the transition function block configured to output an output logic signal, the output logic signal modeling behavior of the logic cell in response to inputs to the one or more input nodes.

10. An article according to claim 9, the analog model comprising one or more input capacitances, each input capacitance coupled to a respective input node.

11. An article according to claim 9, the analog model comprising a resistance coupled to the output of the transition block, the resistance modeling a load at the output of the logic cell.

12. An article according to claim 9, the transition timing parameters for a particular entry including at least one of: a delay between the input transition and the output transition for the particular entry, an output transition rise time for the particular entry, an output transition fall time for the particular entry, and a load resistance for the particular entry for modeling output load for the particular entry.

13. An article according to claim 9, further comprising optimizing the analog module, wherein optimizing the analog module comprises:

simulating the analog model based on parasitic capacitances of the logic cell as written in one or more analog netlists to determine a first set of output timing characteristics of the logic cell;

simulating the analog model based on selected parameters of the parameterized transition-based analog model to determine a second set of output timing characteristics of the logic cell; and updating the analog model to include the selected parameters if the percentage error between the first set of output timing characteristics of the logic cell and the second set of output timing characteristics of the logic cell are within a tolerance.

14. An article according to claim 9, the digital model written in a digital modeling language.

15. An article according to claim 9, the analog model written in an analog modeling language.

16. An article according to claim 9, the parameterized transition based analog model written in an analog modeling language.

17. A computing system comprising:

a processor; and a computer-readable medium communicatively coupled to the processor and having stored thereon one or more computer-executable instructions readable by a processor, the instructions, when read and executed, for causing the processor to:

generate logical transition data for the logic cell based on an analysis of a digital model for the logic cell, the logical transition data including at least one entry indicative of an output transition of the logic cell occurring in response to an input transition of the logic cell;

generate a parameterized transition based analog model for the logic cell, the parameterized transition based analog model including transition timing parameters associated with each entry of the logical transition data; and generate an analog model for the logic cell based on the parameterized transition based analog model and one or more analog netlists characterizing the logic cell, the analog model including:

one or more input nodes, each input node representing an input of the logic cell;

one or more output nodes, each output node representing an output of the logic cell;

a logic block for modeling Boolean logic of the logic cell, the logic block receiving each of the one or more input nodes as an input and configured to calculate an output based on the received input;

a multiplexer receiving the output of the logic block as a select input, and receiving a low threshold signal and a high threshold signal at its data inputs and configured to output a transitioning analog signal;

a transition-based parameter block receiving each of the one or more input nodes as an input and configured to, based on values of the one or more input nodes and parameters selected from the parameterized transition based analog model, output transition timing parameters; and a transition function block receiving the output of the multiplexer and the transition timing parameters, the transition function block configured to output an output logic signal, the output logic signal modeling behavior of the logic cell in response to inputs to the one or more input nodes.

18. A computing system according to claim 17, the analog model comprising one or more input capacitances, each input capacitance coupled to a respective input node.

19. A computing system according to claim 17, the analog model comprising a resistance coupled to the output of the transition block, the resistance modeling a load at the output of the logic cell.

20. A computing system according to claim 17, the transition timing parameters for a particular entry including at least one of: a delay between the input transition and the output transition for the particular entry, an output transition rise time for the particular entry, an output transition fall time for the particular entry, and a load resistance for the particular entry for modeling output load for the particular entry.

21. A computing system according to claim 17, further comprising optimizing the analog module, wherein optimizing the analog module comprises:
- simulating the analog model based on parasitic capacitances of the logic cell as written in one or more analog netlists to determine a first set of output timing characteristics of the logic cell;
- simulating the analog model based on selected parameters of the parameterized transition-based analog model to determine a second set of output timing characteristics of the logic cell; and
- updating the analog model to include the selected parameters if the percentage error between the first set of output timing characteristics of the logic cell and the second set of output timing characteristics of the logic cell are within a tolerance.

* * * * *